United States Patent [19]

Hiraki et al.

[11] Patent Number: 4,647,472
[45] Date of Patent: Mar. 3, 1987

[54] PROCESS OF PRODUCING A SEMICONDUCTOR DEVICE

[75] Inventors: Shunichi Hiraki, Hiratsuka; Yoshikazu Usuki, Chigasaki; Kazuhiro Takimoto, Kawasaki, all of Japan

[73] Assignee: Tokyo Shibaura Denki Kabushiki Kaisha, Japan

[21] Appl. No.: 758,854

[22] Filed: Jul. 26, 1985

Related U.S. Application Data

[62] Division of Ser. No. 565,103, Dec. 23, 1983.

[30] Foreign Application Priority Data

Dec. 24, 1982 [JP] Japan .................... 57-232953

[51] Int. Cl.⁴ ............................................. B05D 3/06
[52] U.S. Cl. ........................................ 427/39; 427/95
[58] Field of Search ............................ 427/39, 95

[56] References Cited

U.S. PATENT DOCUMENTS

| | | |
|---|---|---|
| 3,485,666 | 12/1969 | Sterling et al. |
| 4,161,743 | 7/1979 | Yonezawa et al. ............ 357/54 |
| 4,360,822 | 11/1982 | Roger ............................ 357/56 |
| 4,544,423 | 10/1985 | Tsuge et al. ................... 427/39 |

FOREIGN PATENT DOCUMENTS

| | | |
|---|---|---|
| 1589866 | 11/1967 | Fed. Rep. of Germany . |
| 1566072A | 1/1978 | United Kingdom . |
| 2043989A | 2/1979 | United Kingdom . |
| 2027273A | 3/1980 | United Kingdom . |

OTHER PUBLICATIONS

Official Action of German Patent Office, Dec. 16, 1985, for Pat. Appln. P 33 46 803.6-33 and English Translation.

IBM Technical Disclosure Bulletin, vol. 13, No. 12, May 1971, "Vapor Deposition With Unsaturated Hydrocarbons", R. S. Prabhu.

IBM Technical Disclosure Bulletin, vol. 18, No. 12, May 1976, "Thick Wear Resistant Coatings for Silicon Devices", Poponiak et al.

Primary Examiner—Bernard D. Pianalto
Attorney, Agent, or Firm—Finnegan, Henderson, Farabow, Garrett & Dunner

[57] ABSTRACT

A semiconductor device which has a protective film having a high blocking capacity against contaminating ions and a high shielding effect against an external electric field. The protective film is formed on a surface of the semiconductor device. The protective film consists essentially of an amorphous or polycrystalline silicon carbide which contains at least one element selected from the group consisting of hydrogen, nitrogen, oxygen and a halogen.

8 Claims, 4 Drawing Figures

PROCESS OF PRODUCING A SEMICONDUCTOR DEVICE

This application is a division, of application Ser. No. 06/565,103, filed Dec. 23, 1983.

BACKGROUND OF THE INVENTION

I. Field of the Invention

The present invention relates to a semiconductor device having an improved protective film and a process of producing the same. The present invention also relates to a process of protecting a semiconductor device.

II. Description of the Prior Art

Generally, the reliability of semiconductor elements greatly depends on the stability of their surfaces. In order to stabilize the element surface, a protective film (passivation film) is normally formed thereon. The material of the protective film can be selected from a variety of materials.

For example, in a planar semiconductor device, a clean silicon oxide film which contains substantially no alkali ions, or a multilayer film obtained by forming a phosphosilicate glass film (PSG film), a nitride film or an alumina film on the above-mentioned silicon oxide film, is used as the protective film.

Inorganic insulating films such as the PSG film, the nitride film and the alumina film have a large diffusion blocking capacity against contaminating ions. However, when these films are formed by CVD (chemical vapor deposition) or sputtering, the following problems are presented: (a) it is difficult to form a nondefective thick film, so that a withstand voltage tends to decrease; and (b) a charge density in the film is high, so that the withstand voltage tends to decrease, a collector leakage current $I_{CBO}$ tends to increase, and a current amplification ratio $h_{FE}$ tends to decrease.

In a semiconductor element having a high withstand voltage, polarization caused by ionic contamination and an influence of an external electric field must both be minimized. Typically, the dielectric withstand voltage of the element is decreased by a high charge density in the protective film, so that the inorganic insulating films described above cannot be used. In view of this problem, a polyimide film capable of thick film formation, a low melting glass film and a polycrystalline silicon semiinsulating film having a high shielding effect against an external electic field are used as protective films for elements having a high withstand voltage.

However, these films have the following drawbacks. Polyimide can be formed into a thick film without crystal defects. However, an inherent polarization property of organic resins is great in the polyimide film. Therefore, the polyimide film is greatly influenced by an external electric field and has a low hygroscopic resistance.

It is difficult to form a low melting glass film on an aluminum wiring layer. The thermal expansion coefficient of the low melting glass film greatly differs from that of silicon. As a result, the low melting glass film is susceptible to cracking, thus lowering the product yield.

A polycrystalline silicon semiinsulating film can be formed directly on the silicon substrate, so that a high shielding effect against an external electric field can be obtained. However, this film has a high crystal defect (trap) density, so that a high reverse current tends to flow from the substrate to this insulating film. Furthermore, since the film is formed at a temperature of 600° C. or more, it must be formed before the aluminum wiring layer is formed.

SUMMARY OF THE INVENTION

It is, therefore, an object of the present invention to provide a highly reliable, high withstand voltage semiconductor device having a protective film which has a high blocking capacity against contaminating ion diffusion and a high shielding effect against an external electric field.

It is another object of the present invention to provide a process of producing the semiconductor device.

It is still another object of the present invention to provide a process of protecting a semiconductor device.

According to an aspect of the present invention, the surface of a semiconductor element is covered with a protective film of an amorphous or polycrystalline silicon carbide which contains as an impurity at least one element selected from the group consisting of hydrogen, nitrogen, oxygen and a halogen.

In other words, the present invention provides a semiconductor device including a semiconductor substrate having an element region therein and the above-mentioned protective film.

According to another aspect of the present invention, there is provided a process of protecting a semiconductor device with the protective film.

DETAILED DESCRIPTION OF THE PREFERRED EMBODIMENTS

Semiconductor devices of the present invention include all known semiconductor devices each covered with a protective film of an amorphous or polycrystalline silicon carbide which contains as an impurity at least one element selected from the group consisting of hydrogen, nitrogen, oxygen and a halogen.

Figure 1:
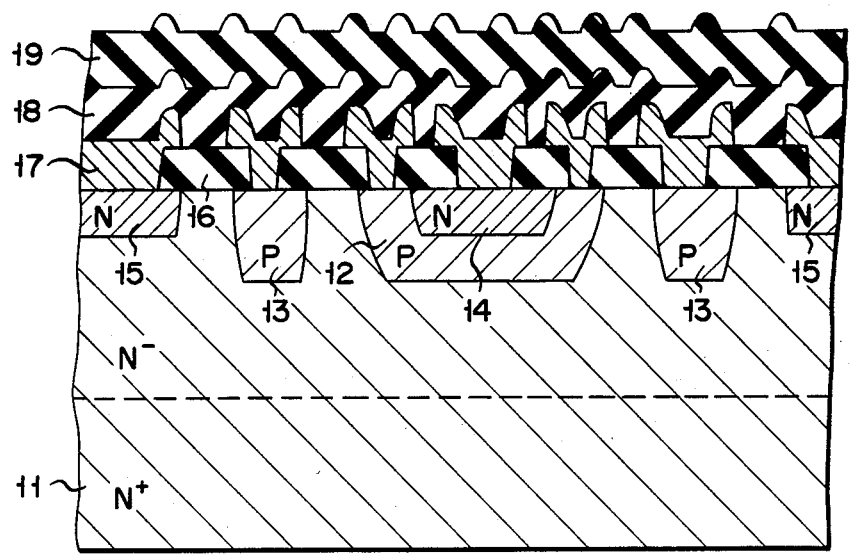
FIG. 1 is a schematic sectional view of a planar semiconductor device of the present invention.

As a typical example, a planar semiconductor device which employs the present invention will be described with reference to FIG. 1.

A silicon substrate 11 having an $n^-$-type silicon region on an $n^+$- type silicon region is prepared. A base region 12 and a guard ring region 13 are simultaneously formed by a well-known process in the silicon substrate 11. Thereafter, an emitter region 14 and a channel cut region 15 are formed.

Thereafter, an aluminum electrode wiring layer 17 is formed to contact the respective regions through contact holes formed in a silicon oxide film 16 formed on the silicon substrate 11.

The above process is a well-known process for manufacturing a planar semiconductor device. Thoughout the specification, this process or manufacturing the planar semiconductor device need not be further described, and further description thereof will be omitted.

The surface of the planar semiconductor device described above is covered with a protective film 18 of an amorphous or polycrystalline silicon carbide which includes as an impurity at least one element selected from the group consisting of hydrogen, nitrogen, oxygen and a halogen. The protective film 18 of an amorphous silicon carbide can be formed by plasma CVD using $SiH_mX_n$ (wherein X is a halogen, each of m and n is an integer falling within the range between 0 and 4, and m+n=4), propane and a small amount of nitrogen monoxide. Plasma CVD is well-known as one of semiconductor device processing techniques, and a detailed description thereof will be omitted. The protective film 18 can be formed, for example, under the conditions that a discharge frequency is about 13.56 MHz, a pressure falls within the range between about 0.1 and 1.0 torr, a temperature falls within the range between 350° C. and 600° C., and an output power falls within the range between 150 and 500 W. The protective film 18 preferably has a thickness of 0.5 μm or more. In this case, the ratio of $SiH_mX_n$ to $C_3H_8$ to $N_2O$ is about 40:1,200:15 (cc/min.).

The protective film 18 can also be formed by reduced pressure CVD technique. In this case, $SiH_4$ and methane, or silane and propane can be used as a source gas mixture. $NH_3$ can be used as a nitrogen source; $N_2O$ can be used as an oxygen source; and $SiCl_4$ or $SiF_4$ can be used as a halogen source. In this case, a reaction temperature is preferably 800° C. or more. A ratio of silane to methane or propane is, for example, 1:10, and any other impurity content can be determined suitably. Substantially no hydrogen is left in a polycrystalline silicon carbide film.

The contents of the impurities in the amorphous or polycrystalline silicon carbide film are preferably less than about 1/10 of the stoichiometric composition of the compound formed between the impurity element and silicon. For example, when chlorine is contained as an impurity, the compound of chlorine and silicon is $SiCl_4$, and this compound contains 4 chlorine atoms with respect to 1 silicon atom, so that the content of chlorine is preferably 0.4 mol or less with respect to 1 mol of silicon.

In this manner, the semiconductor device having the protective film 18 described above can be obtained. When the semiconductor device comprises a planar semiconductor device, an insulating layer 19 having a dielectric constant of 7 or higher is preferably formed on the protective film 18. Then, the dielectric withstand voltage of the semiconductor device can be further increased. A material such as $Al_2O_3$, $Si_3N_4$, $Nb_2O_3$, $HfO_2$, $Ta_2O_3$ and a low melting glass (e.g., ZnO or PbO-based) can be used as the material of the insulating film 19.

Figure 2:
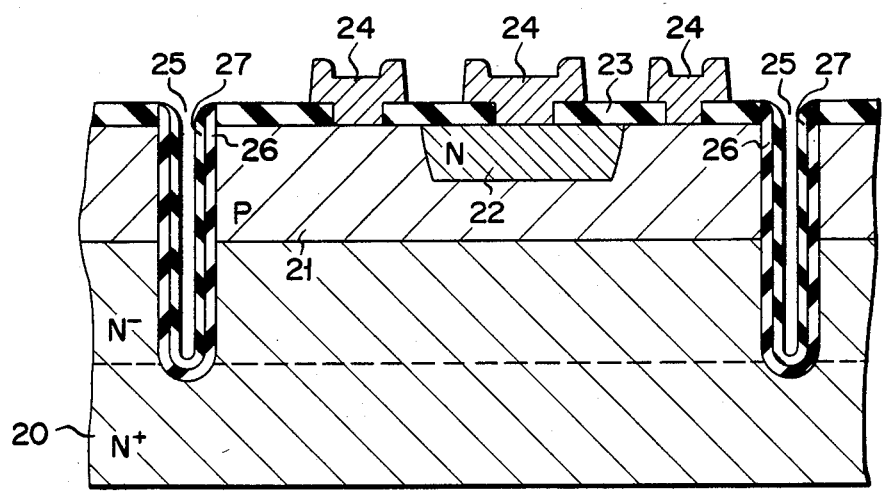
FIG. 2 is a schematic sectional view of a mesa semiconductor device of the present invention.

An embodiment will be described in which the present invention is applied to a mesa transistor, referring to FIG. 2. A base layer 21 and an emitter region 22 therein are formed on a silicon substrate 20 having an $n^-$-type region on an $n^+$-silicon region. Therafter, a mesa groove 25 is formed. A protective film 26 of an amorphous or polycrystalline silicon carbide including as an impurity at least one element selected from the group consisting of hydrogen, nitrogen, oxygen and a halogen is formed by the same process as described above on the surface of the mesa groove 25. An electrode wiring layer 24 is formed through contact holes formed in a silicon oxide film 23, thereby completing formation of the semiconductor element. Thereafter, an inorganic or organic thick insulating film 27 such as an epoxy resin film is formed in the mesa groove 25 so as to prevent discharge.

EXAMPLE 1

Planar npn transistors were formed by a known method. An amorphous silicon carbide layer was formed on the surface of the each transistor as a protective film by plasma CVD to cover the entire surface to a thickness of about 1.0 μm. The protective film contained as an impurity hydrogen, nitrogen, oxygen and a halogen. The composition of the gas mixture was such that the ratio of $SiH_2Cl_2:C_3H_8:N_2O$ was 40:1,200:15 (cc/min.). In this case, the reaction conditions were such that the discharge frequency was 13.56 MHz, the pressure was 0.5 Torr, the reaction temperature was 350° C., and the output power was 400 W.

On the other hand, conventional planar npn semiconductor devices each having as a protective film a conventional PSG film, a conventional $Si_3N_4$ film or a conventional polyimide film were prepared.

Figure 3:
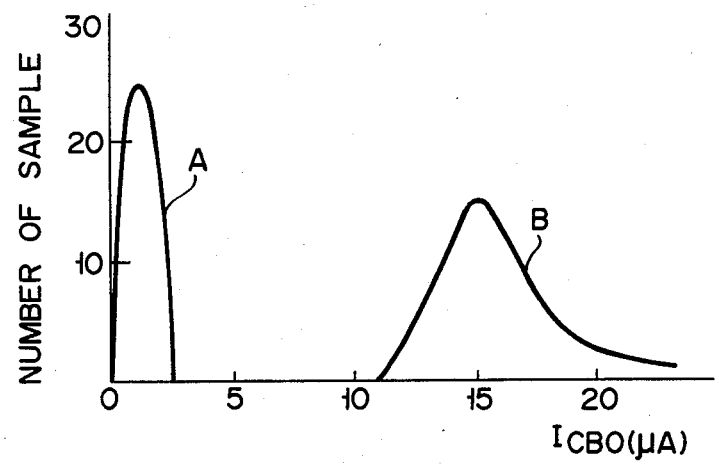
FIG. 3 is a graph showing magnitudes of collector leakage currents of the semiconductor device of the present invention in comparison with the conventional semiconductor device in a bias temperature test.

The semiconductor device of the present invention was compared with the conventional semiconductor device when a base-collector voltage $V_{CB}$ of 600 V was applied at a temperature of 150° C. in a BT (bias temperature) test for 500 hours so as to measure a collector leakage current. Results are illustrated in FIG. 3. The number of samples was 200 semiconductor devices of the present invention and 200 conventional semiconductor devices. Referring to FIG. 3, reference symbol A indicates the case of the semiconductor devices of the present invention, and reference symbol B indicates the case of the conventional semiconductor devices.

As is apparent from FIG. 3, substantially no increase in the base-collector leakeage current $I_{CBO}$ is found in the semiconductor devices of the present invention in a BT test.

A similar BT test was conducted for the semiconductor devices of the present invention each having a polycrystalline silicon carbide film as a protective film in comparison with the conventional semiconductor devices. Substantially the same results were obtained as in FIG. 3.

EXAMPLE 2

The semiconductor device of the present invention was prepared in the same manner as in Example 1. On the other hand, conventional semiconductor devices each having as a protective film a PSG film or silicon dioxide film were prepared. In either case, the thickness of the protective film was about 250 nm.

Figure 4:
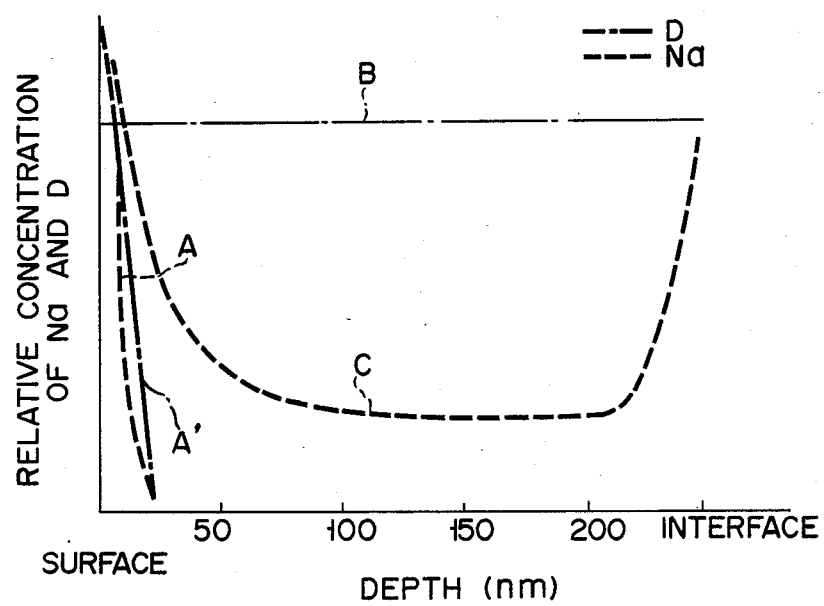
FIG. 4 is a graph showing the concentration profiles of Na and D in the protective film of the semiconductor device of the present invention and of the conventional semiconductor device in a pressure cooker test.

A PCT (pressure cooker test) was performed in water containing heavy water $D_2O$ and Na ions. The concentration distribution of Na and D was examined along a depth of the protective film. Results are illustrated in FIG. 4. Referring to FIG. 4, curves A, A', B and C respectively indicate the sodium distribution in the amorphous silicon carbide film, the heavy hydrogen distribution in the amorphous silicon carbide film, the heavy hydrogen distribution in the PSG film, and the sodium distribution in the silicon dioxide film. As is apparent from FIG. 4, in the semiconductor device of the present invention, Na and D can permeate to a depth of only 30 nm from the surface of the protective film.

What is claimed is:

1. A process of producing a semiconductor device, comprising the steps of:
    preparing a semiconductor substrate having an element region; and
    forming a protective film on said semiconductor substrate by plasma chemical vapor deposition by using a gas mixture of $SiH_mX_n$ (wherein X is a halogen, each of m and n is an integer falling within a range between 0 and 4, and m+n=4), a saturated hydrocarbon selected from the group consisting of methane, and propane, and nitrogen monoxide.

2. A process of producing a semiconductor device, comprising the steps of:
    preparing a semiconductor substrate having an element region; and
    forming a protective film by reduced pressure chemical vapor deposition using a gas mixture of silane, a saturated hydrocarbon selected from the group consisting of methane, and propane, and nitrogen monoxide.

3. The process of claim 1, wherein the ratio of $SiH_mX_n$ to propane the saturated hydrocarbon to nitrogen monoxide in the gas mixture is about 40 to 1,200 to 15 cc/min.

4. The process of claim 1, wherein the temperature during the forming step is in the range of about 350° C. to 600° C. and the pressure is in the range of about 0.1 torr to 1.0 torr.

5. The process of claim 1, wherein the semiconductor substrate is a silicon semiconductor substrate.

6. The process of claim 2, wherein the ratio of silane to propane the saturated hydrocarbon in the gas mixture is about 1 to 10.

7. The process of claim 2, wherein the temperature during the forming step is greater than 800° C.

8. The process of claim 2, wherein the semiconductor substrate is a silicon semiconductor substrate.

* * * * *